United States Patent
Liu et al.

(10) Patent No.: US 10,262,724 B2
(45) Date of Patent: Apr. 16, 2019

(54) MEMORY CELL OF STATIC RANDOM ACCESS MEMORY BASED ON DICE STRUCTURE

(71) Applicant: Institute of Automation Chinese Academy of Sciences, Beijing (CN)

(72) Inventors: Li Liu, Beijing (CN); Jingqiu Wang, Beijing (CN); Liang Chen, Beijing (CN)

(73) Assignee: Institute of Automation Chinese Academy of Sciences, Beijing (CN)

( * ) Notice: Subject to any disclaimer, the term of this patent is extended or adjusted under 35 U.S.C. 154(b) by 0 days.

(21) Appl. No.: 15/551,024

(22) PCT Filed: Mar. 27, 2015

(86) PCT No.: PCT/CN2015/075320
§ 371 (c)(1),
(2) Date: Aug. 14, 2017

(87) PCT Pub. No.: WO2016/154825
PCT Pub. Date: Oct. 6, 2016

(65) Prior Publication Data
US 2018/0174648 A1    Jun. 21, 2018

(51) Int. Cl.
*G11C 11/419*    (2006.01)
*G06F 3/06*    (2006.01)
(Continued)

(52) U.S. Cl.
CPC .......... *G11C 11/419* (2013.01); *G06F 3/0619* (2013.01); *G11C 11/4125* (2013.01); *G11C 29/74* (2013.01); *H01L 27/11* (2013.01)

(58) Field of Classification Search
CPC ... G11C 11/419; G11C 11/4125; G11C 29/74; G06F 3/0619
See application file for complete search history.

(56) References Cited

U.S. PATENT DOCUMENTS

| 9,536,585 B2* | 1/2017 | Liu .......................... G11C 11/34 |
| 2010/0110773 A1* | 5/2010 | Sachdev ............... G11C 11/412 |
| | | 365/154 |
| 2010/0172195 A1* | 7/2010 | Moore .................. G11C 5/005 |
| | | 365/189.16 |

FOREIGN PATENT DOCUMENTS

| CN | 103021456 A | 4/2013 |
| CN | 103337252 A | 10/2013 |
| CN | 103903645 A1 | 7/2014 |

OTHER PUBLICATIONS

PCT/CN2015/075320 International Search Report.
(Continued)

*Primary Examiner* — Pho M Luu
(74) *Attorney, Agent, or Firm* — Jeremy Howard; Howard IP Law, PLLC

(57) ABSTRACT

A memory cell of a static random access memory based on DICE structure, which includes a redundant information latch circuit and a redundant bit selection circuit. The redundant information latch circuit is formed by four MOS transistors and includes four data storage nodes, the redundant bit selection circuit is formed by four MOS transistors M0, M1, M2 and M3, with their drains connected to the four data storage nodes X0, X1, X2 and X3. Sources of M0 and M2 are connected to each other and are connected to a bit line BL, sources of M1 and M3 are connected to each other and are connected to a bit line BLB; and gates of the four MOS transistors are connected to each other and are connected to a word line WL.

3 Claims, 3 Drawing Sheets

(51) Int. Cl.
   *H01L 27/11*     (2006.01)
   *G11C 11/412*    (2006.01)
   *G11C 29/00*     (2006.01)

(56) References Cited

OTHER PUBLICATIONS

Eftaxiopoulos, N. et al., "An Independent Dual Gate SOI FinFET Soft-Error Resilient Memory Cell", 2014 International Design and Test Symposium, vol., No., Dec. 31, 2014 (31.23.2014), ISSN: , pp. 39-40, and figure 1.
Axelos, N. et al., "FF-DICE: An 8T Soft-Error Tolerant Cell Using Independent Dual Gate SOI FinFETs", 2014 IEEE 20th International On-Line Testing Symposium (IOLTS), vol. ,No., Jul. 9, 2014 (Jul. 9, 2014), ISSNP: , pp. 200-201, and figure 1.
Calin, T. et al., "Upset Hardened Memory Design for Submicron CMOS Technology", IEEE Transactions on Nuclear Science, vol. 43, No. 6, Dec. 31, 1996 (Dec. 31, 1996), ISSN:, the whole document.

\* cited by examiner

MEMORY CELL OF STATIC RANDOM ACCESS MEMORY BASED ON DICE STRUCTURE

TECHNICAL FIELD

The Present invention relates to the technology of design and manufacturing of integrated circuits, in which a static random access memory is involved, and in particular to a memory cell of a static random access memory based on DICE structure, which can be applied in military and civilian affairs and in the field of spaceflight for commercial purpose, especially the invention is suitable for applications of high-performance and high-density anti-radiation.

BACKGROUND OF THE INVENTION

Single event upset is an important parameter of radiation reinforcement. One-time single event upset or soft error refers to a non-destructive data transformation on a data storage bit. Charged particles (such as cosmic rays or trapped protons) are incident into a semiconductor device and quickly lose their energies because of interaction with semiconductor materials. The energies lost enable the electrons to jump from a valence band to a conduction band, thus the conduction band has electrons and the valence band has holes, forming electrons-hole pairs, which leads to unbalanced carriers. When there is no electric field, the unbalanced carriers will diffuse, recombine and finally disappear. When there is an electric field, the unbalanced carriers (electron-hole pairs) will separate and be collected by electrodes to form transient current. The transient current will change the node potential and cause a turnover of the logical state of the device; or the transient current will propagate along a signal transmission path, thus interfering the normal function of the circuit. For a memory cell of CMOS SRAM, the reverse-biased PN junction space charge region in the drain region of an off-state transistor become the single event upset sensitive region of the device, whose electric field is strong enough to make the electron-cavity pairs separated and collected by electrodes.

Currently, a typical memory cell has a 6T structure. As shown in FIG. 1, a 6T SRAM unit includes two identical inverters in cross connection, which form a latch circuit, namely, an output of one inverter is connected to an input of another inverter. The latch circuit is connected between a power supply and a ground potential. Each inverter comprises an NMOS pull-down transistor N1 or N2 and a PMOS pull-up transistor P1 or P2. Outputs of the inverter are two storage nodes Q and QB. When one of the storage nodes is pulled down to a low voltage, the other storage node will be pulled up to a high voltage, thus forming a complementary pair. A pair of complementary bit lines BL and BLB are connected to the storage nodes Q and QB via a pair of transmission gate transistors N3 and N4. Gates of the transmission gate transistors N3 and N4 are connected to a word line WL.

Suppose that the state of the memory cell is "1", namely, Q is a high level and QB is a low level, P1 and N2 transistors are turned on and N1 and P2 transistors are turned off, and a reverse-biased PN junction space charge region in the drain regions of N1 and P2 transistors is the single event upset sensitive region of the device. With respect to N1 transistor, the transient current causes the voltage of the drain (i.e. Q storage point) to drop and be coupled to gates of P2 and N2, thus turning off N2 transistor and turning on P2 transistor, voltage of the drain (i.e. QB storage point) of N2 transistor is raised and fed back to gates of P1 and N1 transistors, thus turning off P1 transistor and turning on N1 transistor, and the state of the memory cell changes thoroughly from "1" into "0". That is, in a radiation environment, single event upset is liable to occur in the memory cell with a 6T structure, which influences the contents stored, and the wrong value will remain until the memory cell is rewritten next time.

In order to solve the problem of single event upset in the memory cell caused by high-energy particles (high-energy protons, heavy ions) hitting the storage node, usually the two measures of process reinforcement and circuit design reinforcement are adopted. There are usually three methods for circuit design reinforcement. The first method is to add a capacitance or resistance delay element in a storage node of the memory cell, as shown in FIG. 2 and FIG. 3. When the incidence of charged particles causes a potential of the drain of N1 transistor to drop to a low voltage while P1 transistor is still on, the memory cell is in an unstable state, and there is a contention between two processes. On the one hand, a power supply charges a gate capacitor of N2 transistor through P1 to cause the drain voltage of N1 transistor to rise and thus restore to the initial state; on the other hand, the drain voltage of N1 transistor drops to couple to another inverter gate, and is then fed back to turn on N1 transistor and turn off P1 transistor, thus the state of the memory cell is reversed. By increasing RC delay, the transient current delays the time of overturning the logical circuit, thus allowing the node voltage change caused by the peak transient current to have time to restore to the initial value. Disadvantages of said method include a large resistance-capacitance value is needed on the chip, the area of the resistance-capacitance is too large, and the time of write increases greatly. The second method is to add coupling capacitors between two storage nodes, as shown in FIG. 4. The principle of said method is that when one of the nodes is hit by high-energy particles, the transient current generated makes the voltage of one of the nodes to jump, and the voltage of the other node jumps in the same direction under the influence of the coupling capacitors, so that the memory cell cannot be reversed. This method is also limited by the difficulty and area of manufacturing the capacitor and by the time of write. The third method is to use a multi-transistor element to realize redundant preservation of the stored information, as shown by the 12T DICE structure in FIG. 5. Four inverters are connected end to end, wherein the storage nodes are respectively connected to NMOS of the previous stage and to PMOS of the subsequent stage, so that both forward and backward storage data are redundantly preserved, and once a certain storage node has single event upset, the connected node voltage will only influence storage nodes of the previous or subsequent stage, and the stage that is not influenced restores information on the jumped storage node. The disadvantages of said method include requiring too many transistors and occupying too large an area.

SUMMARY OF THE INVENTION

The object of the present invention is to provide a memory cell of a static random access memory based on DICE structure, and only by increasing a small amount of area without increasing complexity, the memory cell can be prevented from having a state reverse when being hit by particles, thus ensuring correctness of data.

The memory cell of a static random access memory based on DICE structure provided by the present invention makes a redundant backup for the basic memory cell based on the idea of using a multi-transistor unit to perform redundant preservation for the memory cell, thus achieving the object of preventing single event upset. Meanwhile, the basic cell is optimized to reduce the number of transistors thereof, thereby reducing the area overhead of the radiation-reinforced memory cell. The memory cell of a static random access memory based on DICE structure provided by the present invention, as shown in FIG. 6, comprises a redundant information latch circuit and a redundant bit selection circuit, the redundant information latch circuit is formed by four MOS transistors connected end to end, with their drains corresponding to four data storage nodes X0, X1, X2 and X3; the redundant bit selection circuit is also formed by four MOS transistors M0, M1, M2 and M3, with their drains connected to the four data storage nodes X0, X1, X2 and X3; wherein sources of M0 and M2 are connected to each other and are connected to a bit line BL, sources of M1 and M3 are connected to each other and are connected to a bit line BLB; and gates of the four MOS transistors are connected to each other and are connected to a word line WL.

The present invention reduces the number of transistors of the basic memory cell and realizes "dual-mode" for storage nodes of the basic memory cell so as to form an inter-lock design, thus reducing area overhead while realizing radiation reinforcement.

DETAILED DESCRIPTION OF THE PREFERRED EMBODIMENTS

To make the object, technical solution and advantages of the present invention clearer, the present invention is described in further detail below in conjunction with specific embodiments and with reference to the drawings.

Figure 1:
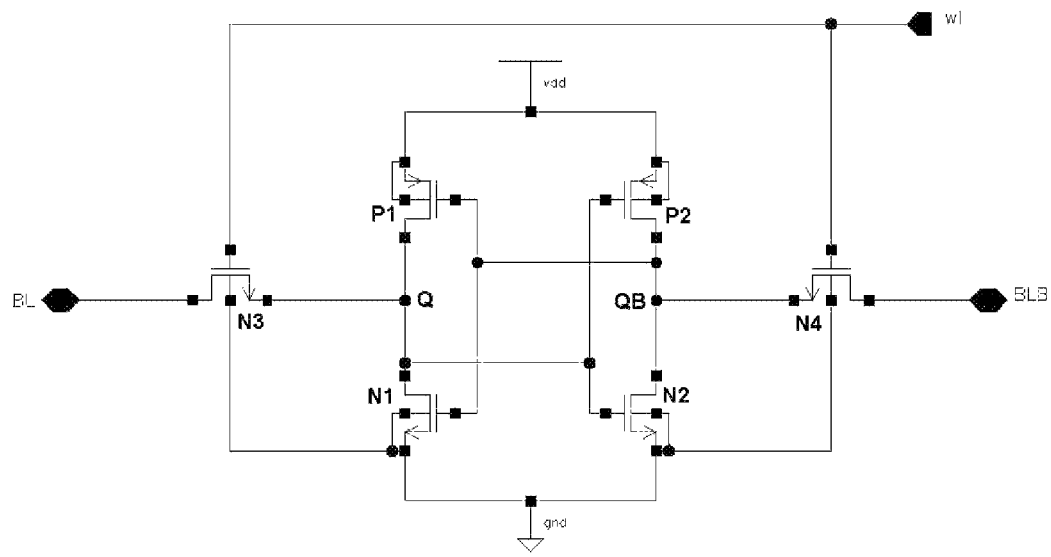
FIG. 1 is a conventional 6T SRAM memory cell.
Figure 2:
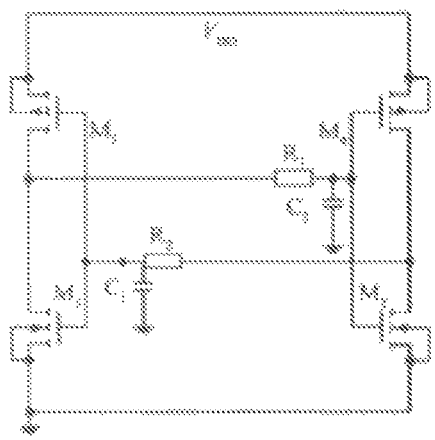
FIG. 2 is a memory cell with storage nodes and resistance-capacitors.
Figure 3:
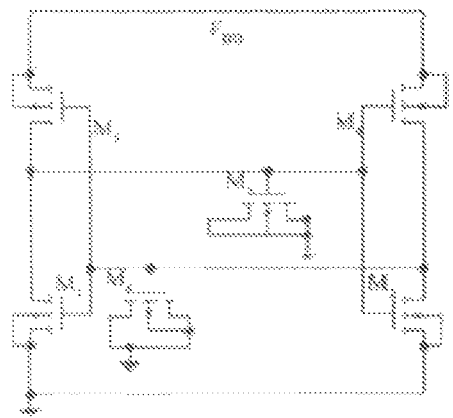
FIG. 3 is a memory cell with resistance-capacitors replaced by mos capacitors.
Figure 4:
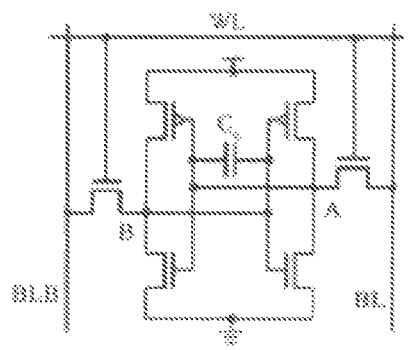
FIG. 4 is a memory cell with storage nodes and coupling capacitors.
Figure 5:
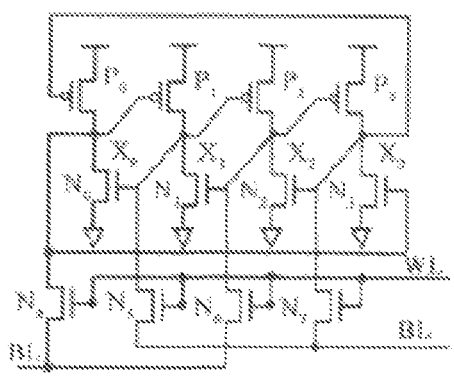
FIG. 5 is a memory cell with DICE structure.
Figure 6:
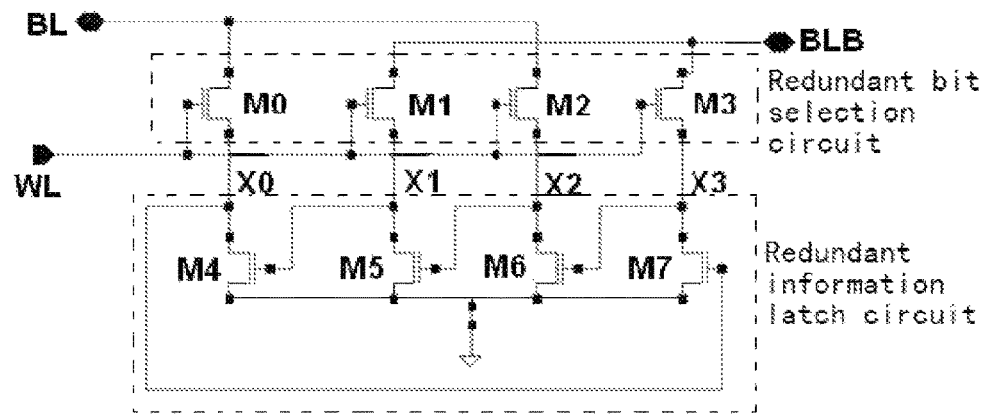
FIG. 6 is a schematic view of a circuit designed according to the present invention.
Figure 7:
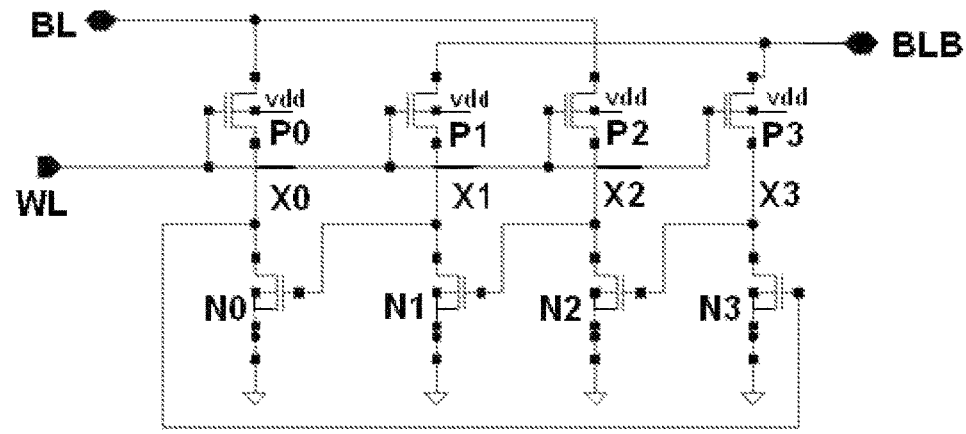
FIG. 7 is a circuit diagram of a first embodiment of the present invention.
Figure 8:
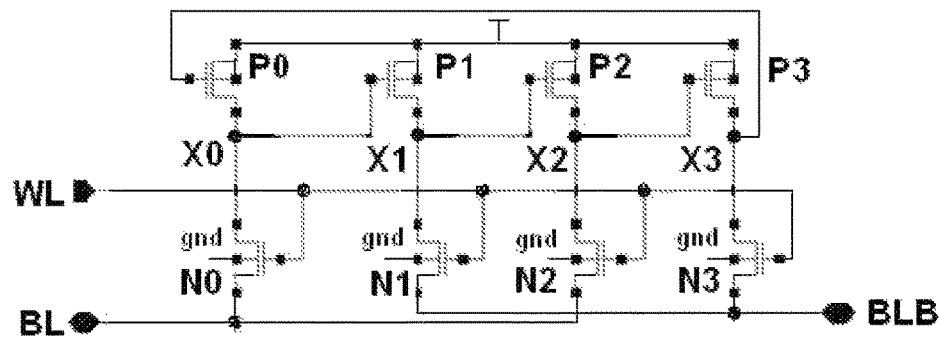
FIG. 8 is a circuit diagram of a second embodiment of the present invention.

FIG. 6 is a schematic view of a circuit designed according to the present invention, and FIG. 7 and FIG. 8 are two embodiments of the present invention. The present invention will be described in detail in connection with the two embodiments as follows.

Embodiment 1

As shown in FIG. 7, the embodiment includes a redundant information latch circuit and a redundant bit selection circuit. The redundant information latch circuit is formed by NMOS transistors N0, N1, N2 and N3 connected end to end; a gate of N0 is connected to a drain of N1 and is connected to storage node X1; a gate of N1 is connected to a drain of N2 and is connected to storage node X2; a gate of N2 is connected to a drain of N3 and is connected to storage node X3; a gate of N3 is connected to a drain of N0 and is connected to storage node X0; the sources of N0, N1, N2 and N3 are connected together and are grounded. The redundant bit selection circuit is formed by PMOS transistors P0, P1, P2 and P3; a drain of P0 is connected to X0, a drain of P1 is connected to X1, a drain of P2 is connected to X2 and a drain of P3 is connected to X3; sources of P0 and P2 are connected to each other and are connected to a bit line BL; sources of P1 and P3 are connected to each other and are connected to a bit line BLB; gates of P0, P1, P2 and P3 are connected together and are connected to a word line WL.

The bit-line pair BL and BLB are pre-charged to a high level and the word line WL is pulled low, and a read operation is started until the word line WL becomes a high level, then the read operation ends; a write drive pulls the BL (or BLB) to the low level, and the word line WL is set to the low level, and a write "0" (or write "1") operation is started until the word line WL becomes a high level, then the write operation ends. In a hold state, the bit-line pair BL and BLB both have a high level and the word line WL also has a high level. The high level of the memory cell is floating. This embodiment uses different thresholds to make a drain current of the PMOS device to be greater than that of the NMOS device, thereby maintaining the high level of the cell. Since the high level is floating, the store states of the cell can be called weak H and strong L Charge collection sensitive regions are regions in which strong electric fields are resulted from reverse biasing of PN junctions in the MOS transistor. When particles hit said regions, ionized electron-hole pairs are separated under the effect of electric fields and are collected by electrodes to form transient current. In a hold state, drain areas of all PMOS transistors and drain areas of turned-off NMOS transistors are charge collection sensitive regions. When a single particle hits a charge collection sensitive region and causes a level reversal, the level reversal will not be passed to all four storage nodes to cause a thorough reversal of the state. As shown in the structure of FIG. 7, suppose that the memory cell stores a high level, i.e. X0="weak H", X1="strong L", X2="weak H" and X3="strong L". The property of overcoming single event upset of said cell will be discussed below in terms of different situations.

Situation 1: particles hit the drain area of transistor P1. Storage node X1 generates a transient current causing X2 to change from strong L into weak H; thus transistor N0 is turned on, so that node X0 is pulled down to L from weak H, which turns off transistor N3; the turning-off of the transistor N3 makes level L of node X3 to float and becomes a weak L; the state of node X3 is not reversed, so node X2 is not influenced. For a while after the reversal, transistor N1 retains on since it is not influenced, and the reversed node X1 restores to its initial state, i.e. strong L; thus N0 is turned off to make node X0 become weak L. In summary, after the single particle event, the cell changes from its initial state, i.e. X0="weak H", X1="strong L", X2="weak H", X3="strong L" into a new state X0="weak L", X1="strong L", X2="weak H", X3="weak L". The new state does not influence the read operation, and it is still that the BLB drops fast when reading, when a voltage difference between BL-BLB reaches a certain value, SA is enabled to read data, which has a high level. That is, when the read operation begins, the data read is the same as the original data; during the read operation, the bit line charges the storage node, so the storage node can restore to its initial state X0="weak H", X1="strong L", X2="weak H", X3="strong L".

Situation 2: particles hit the drain area of transistor N0. Storage node X0 generates a transient current causing X0 to change from weak H into weak L; thus transistor N3 is turned off, and X3 changes from strong L into weak L. storage nodes X1 and X2 are not influenced. After the single particle event, the cell changes from its initial state, i.e. X0="weak H", X1="strong L", X2="weak H", X3="strong L" into a new state X0="weak L", X1="strong L", X2="weak H", X3="weak L". As in the above situation 1, the subsequent read operation will not be influenced, meanwhile, the read operation can also restore the memory cell to its initial state.

Embodiment 2

As shown in FIG. 8, the embodiment also includes a redundant information latch circuit and a redundant bit selection circuit. The redundant information latch circuit is formed by PMOS transistors P0, P1, P2 and P3 connected end to end; a gate of P0 is connected to a drain of P3 and is connected to storage node X3; a gate of P1 is connected to a drain of P0 and is connected to storage node X0; a gate of P2 is connected to a drain of P1 and is connected to storage node X1; a gate of P3 is connected to a drain of P2 and is connected to storage node X2; the sources of P0, P1, P2 and P3 are connected together to power supply. The redundant bit selection circuit is formed by NMOS transistors N0, N1, N2 and N3; a drain of N0 is connected to X0, a drain of N1 is connected to X1, a drain of N2 is connected to X2 and a drain of N3 is connected to X3; sources of N0 and N2 are connected to each other and are connected to a bit line BL; sources of N1 and N3 are connected to each other and are connected to a bit line BLB; gates of N0, N1, N2 and N3 are connected together and are connected to a word line WL.

The bit-line pair BL and BLB are set to a low level and the word line WL is set to a high level, and a read operation is started until the word line WL becomes a low level, then the read operation ends; a write drive pulls the BL (or BLB) to the low level, and the word line WL is set to the high level, and a write "0" (or write "1") operation is started until the word line WL becomes a low level, then the write operation ends. In a hold state, the bit-line pair BL and BLB as well as the word line WL all have low level. The low level of the memory cell is floating. This embodiment uses different thresholds to make a drain current of the NMOS device to be greater than that of the PMOS device, thereby maintaining the low level of the cell. Since the low level is floating, the store states of the cell can be called weak L and strong H.

Charge collection sensitive regions are regions in which strong electric fields are resulted from reverse biasing of PN junctions in the MOS transistor. When particles hit said regions, ionized electron-hole pairs are separated under the effect of electric fields and are collected by electrodes to form transient current. In a hold state, drain areas of all NMOS transistors and drain areas of turned-off PMOS transistors are charge collection sensitive regions. When a single particle hits a charge collection sensitive region and causes a level reversal, the level reversal will not be passed to all four storage nodes to cause a thorough reversal of the state. As shown in the structure of FIG. 8, suppose that the memory cell stores a high level, i.e. X0="strong H", X1="weak L", X2="strong H" and X3="weak L". The property of overcoming single event upset of said cell will be discussed below in terms of different situations.

Situation 1: particles hit the drain area of transistor N0. Storage node X0 generates a transient current causing X0 to change from strong H into weak L; thus transistor P1 is turned on, so that node X1 is pulled up to H from weak L, which turns off transistor P2; the turning-off of the transistor P2 makes level H of X3 to float and becomes a weak H; the state of node X2 is not reversed, so node X3 is not influenced. For a while after the reversal, since transistor P0 retains on, the reversed node X0 will be charged to restore its initial state, i.e. strong H; thus P1 is turned off to make X1 float and become weak H. In summary, after the single particle event, the cell changes from its initial state, i.e. X0="strong H", X1="weak L", X2="strong H", X3="weak L" into a new state X0="strong H", X1="weak H", X2="weak H", X3="weak L". The bit line is set to a low level during reading, and the word line is turned on to start the read operation. Therefore, the new state does not influence the read operation, and it is still that the BLB drops fast, when a voltage difference between BL-BLB reaches a certain value, SA is enabled to read data, which has a high level. That is, when the read operation begins, the data read is the same as the original data; during the read operation, the bit line pulls the states of storage nodes X1 and X3 down to the ground and turns on transistor P2, so after the read operation, X1 changes from "weak H" into "weak L", X2 changes from "weak H" into "strong H". That is, the storage nodes restore to its initial state X0="strong H", X1="weak L", X2="strong H", X3="weak L".

Situation 2: particles hit the drain area of P1 transistor. Storage node X1 generates a transient current causing X1 to change from weak L into weak H; thus transistor P2 is turned off, and node X2 changes from strong H into weak H. Storage nodes X3 and X0 are not influenced. After the particle hitting, the cell changes from its initial state, i.e. X0="strong H", X1="weak L", X2="strong H", X3="weak L" into a new state X0="strong H", X1="weak H", X2="weak H", X3="weak L". As in the above situation 1, the subsequent read operation will not be influenced, meanwhile, the read operation can also restore the memory cell to its initial state.

The above two embodiments only require 8 transistors, so the area overhead is small. It can be seen that by means of the embodiments of the present invention, without obviously increasing complexity and merely increasing a small amount of area, the memory cell of the static random access memory can be prevented from having single event upset in a radiation environment, meanwhile, they are compatible with the universal CMOS technology and are easily implementable.

The above described specific embodiments further illustrate the object, technical solution and beneficial effects of the present invention. It shall be understood that the above-mentioned are merely specific embodiments of the present invention and do not intend to limit the invention. Any modification, equivalent substitution and improvement made according to the spirit and principle of the present invention shall fall into the protection scope of the same.

The invention claimed is:

1. A memory cell of a static random access memory based on DICE structure, characterized by comprising a redundant information latch circuit and a redundant bit selection circuit;
   wherein the redundant information latch circuit is formed by four MOS transistors M4, M5, M6, M7, connected end to end, with their drains corresponding to four data storage nodes X0, X1, X2, X3;
   wherein the redundant bit selection circuit is formed by four MOS transistors M0, M1, M2, M3, with their drains connected to the four data storage nodes X0, X1, X2, X3;
   wherein sources of M0 and M2 are connected to each other and are connected to a bit line BL, sources of M1 and M3 are connected to each other and are connected to a bit line BLB; and gates of the four MOS transistors M0, M1, M2, M3, are connected to each other and are connected to a word line WL.

2. The memory cell of a static random access memory based on DICE structure according to claim 1, characterized in that the redundant information latch circuit is formed by NMOS transistors N0, N1, N2, N3 connected end to end; a gate of N0 is connected to a drain of N1 and is connected to storage node X1; a gate of N1 is connected to a drain of N2 and is connected to storage node X2; a gate of N2 is connected to a drain of N3 and is connected to storage node X3; a gate of N3 is connected to a drain of N0 and is connected to storage node X0; the sources of N0, N1, N2, N3 are all connected to the ground; the redundant bit selection circuit is formed by PMOS transistors P0, P1, P2, P3; a drain of P0 is connected to X0, a drain of P1 is connected to X1, a drain of P2 is connected to X2 and a drain of P3 is connected to X3; sources of P0 and P2 are connected to each other and are connected to the bit line BL; sources of P1 and P3 are connected to each other and are connected to the bit line BLB; gates of P0, P1, P2 and P3 are connected together and are connected to the word line WL.

3. The memory cell of a static random access memory based on DICE structure according to claim 1, characterized in that the redundant information latch circuit is formed by PMOS transistors P0, P1, P2, P3 connected end to end; a gate of P0 is connected to a drain of P3 and is connected to storage node X3; a gate of P1 is connected to a drain of P0 and is connected to storage node X0; a gate of P2 is connected to a drain of P1 and is connected to storage node X1; a gate of P3 is connected to a drain of P2 and is connected to storage node X2; the sources of P0, P1, P2 and P3 are connected to a power supply; the redundant bit selection circuit is formed by NMOS transistors N0, N1, N2, N3; a drain of N0 is connected to X0, a drain of N1 is connected to X1, a drain of N2 is connected to X2 and a drain of N3 is connected to X3; sources of N0 and N2 are connected to each other and are connected to the bit line BL; sources of N1 and N3 are connected to each other and are connected to the bit line BLB; gates of N0, N1, N2 and N3 are connected together and are connected to the word line WL.

* * * * *